(12) United States Patent
Ch'ng et al.

(10) Patent No.: US 8,379,443 B2
(45) Date of Patent: Feb. 19, 2013

(54) CHARGE RETENTION FOR FLASH MEMORY BY MANIPULATING THE PROGRAM DATA METHODOLOGY

(75) Inventors: Sheau-Yang Ch'ng, Penang (MY); Mee-Choo Ong, Penang (MY); Kian-Huat Hoo, Penang (MY)

(73) Assignee: Spansion LLC, Sunnyvale, CA (US)

( * ) Notice: Subject to any disclaimer, the term of this patent is extended or adjusted under 35 U.S.C. 154(b) by 716 days.

(21) Appl. No.: 12/473,037

(22) Filed: May 27, 2009

(65) Prior Publication Data
US 2010/0302846 A1  Dec. 2, 2010

(51) Int. Cl.
*G11C 11/34* (2006.01)
*G11C 16/04* (2006.01)

(52) U.S. Cl. ......... 365/185.03; 365/185.14; 365/185.18; 365/185.25; 365/185.26

(58) Field of Classification Search ............. 365/185.03, 365/185.18, 185.26, 185.14, 185.29, 185.25
See application file for complete search history.

(56) References Cited

U.S. PATENT DOCUMENTS

| | | | | |
|---|---|---|---|---|
| 6,799,256 B2* | 9/2004 | Van Buskirk et al. | ........ | 711/156 |
| 7,289,359 B2* | 10/2007 | Kuo et al. | ................ | 365/185.03 |
| 7,324,374 B2* | 1/2008 | Shieh et al. | ............. | 365/185.03 |
| 2002/0191465 A1* | 12/2002 | Maayan et al. | ............... | 365/222 |
| 2007/0247924 A1* | 10/2007 | Zheng et al. | ............ | 365/185.29 |

* cited by examiner

*Primary Examiner* — Toan Le
(74) *Attorney, Agent, or Firm* — Frommer Lawrence & Haug LLP; Matthew M. Gaffney

(57) ABSTRACT

A method, system and apparatus for determining whether any un-programmed cell is affected by charge disturb by comparing the voltage threshold of the un-programmed cells against a reference voltage. If the voltage threshold for the un-programmed cell exceeds the reference voltage, the failed or defective un-programmed cell will be then be programmed. This will change the defective un-programmed cell to a new programmed value. To account for the location of the failing memory cell, address syndrome bits are used to identify the location of the defective memory cell.

20 Claims, 9 Drawing Sheets

CHARGE RETENTION FOR FLASH MEMORY BY MANIPULATING THE PROGRAM DATA METHODOLOGY

FIELD OF THE INVENTION

The present invention relates generally to a device, system and method for retaining the threshold voltage sensing window in a multi-bit flash memory device. More specifically, the invention provides for detection of excessive charge for an un-programmed bit in a multi-bit cell, and provides a method of accounting for the excessive charge on the un-programmed bit by programming the defective bit and setting address syndrome data.

BACKGROUND OF THE INVENTION

Flash memory is non-volatile memory that can be electrically erased and reprogrammed. It is a technology that is primarily used in memory cards and USB flash drives for general storage and transfer of data between computers and other digital products. It is a specific type of EEPROM (Electrically Erasable Programmable Read-Only Memory) that is erased and programmed in large blocks. Flash memory costs far less than byte-programmable EEPROM and therefore has become the dominant technology wherever there is a need for a significant amount of non-volatile, solid state storage. Examples of consumer electronics applications include PDAs (personal digital assistants), laptop computers, digital audio players, digital cameras and mobile phones. It has also gained popularity in the game console market, where it is often used instead of EEPROMs or battery-powered static random access memory for game save data.

Flash memory stores information in an array of memory cells made from floating-gate transistors. In, for example, a NOR gate flash, the transistors resemble a standard metal-oxide-semiconductor field-effect transistor ("MOSFET") except that the transistor has two gates, a floating gate and a control gate, instead of one. On top is the control gate ("CG"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("$V_T$") of the cell. The threshold voltage of a MOSFET is usually defined as the gate voltage where an inversion layer forms at the interface between the insulating layer (oxide) and the substrate (body) of the transistor. During read-out, a voltage is applied to the CG, and the MOSFET channel will become conducting or remain insulating, depending on the $V_T$ of the cell, which is in turn controlled by the charge on the FG. The current flow through the MOSFET channel is sensed which permits a determination of the voltage threshold for the device, which in turn provides information about the binary data stored within the device.

In a single cell device, each control gate of a transistor stores a single charge amount that represents the stored information. In its default or "un-programmed" state, it is logically equivalent to a binary "1" value, because current will flow through the channel under application of an appropriate voltage to the control gate.

In a dual cell device, each control gate stores two charge amounts that represents the stored information. That is, two physically distinct quantities of charge are stored on opposite sides of the floating gate. Reading or writing data on one side of the floating gate occurs independently of the data that is stored on the opposite side of the floating gate. In this technology, the FG is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layers. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

In a single-level cell ("SLC") device, each cell stores only one bit of information, either the cell is "un-programmed" (has a "1" value) or "programmed" (has a "0" value). There also exists multi-level cell ("MLC") devices that can store more than one bit per cell by choosing between multiple levels of electrical charge to apply to the floating gates of its cells. In these devices, the amount of current flow is sensed (rather than simply its presence or absence), to determine more precisely the level of charge on the FG.

As one example, a dual cell device may also be a MLC device that stores four-bits-per-cell so that one transistor equates to 16 different states. This enables greater capacity, smaller die sizes and lower costs for the flash devices.

BRIEF DESCRIPTION OF THE DRAWINGS

Non-limiting and non-exhaustive embodiments of the present invention are described with reference to the following drawings, in which.

DETAILED DESCRIPTION

Figure 1:
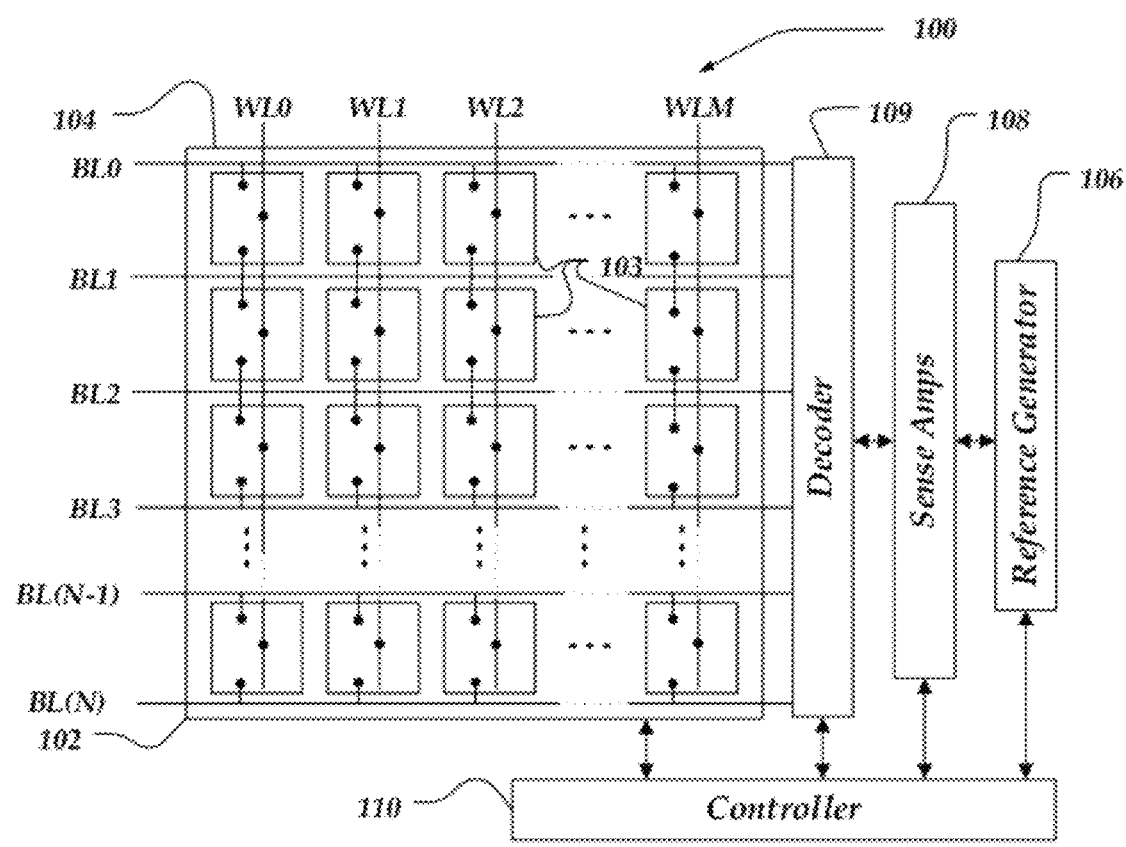
FIG. 1 is a block diagram of an embodiment of a flash memory device.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The term "memory cell" refers to a memory device configured to store at least one logic level. In one embodiment, a memory cell can be configured to store a bit or binary datum indicative of a logic level, such as a "0" or a "1." In another embodiment, a memory cell can have one of three or more logic levels. In yet another embodiment, a single device can have two memory cells, which is commonly referred to as a dual cell device. In general, a memory cell is typically arrayed with other memory cells to store an amount of data spanning, for example, a Byte, a Kilobyte, Megabyte, Gigabyte, a Terabyte, and larger. In one embodiment, memory cells can be flash memory cells configured to be single cell, dual cell, SLC, MLC or combinations thereof.

A "multi-cell memory" is a memory that is configured to store at least one logic level in at least two distinct locations within an individual memory device. A dual cell memory device is an example of a multi-cell memory. Each of the cells within a dual cell memory device may be a SLC or MLC.

The term "bit line" as used herein refers to a conductive structure that is configured to electrically inter-couple portions of a memory. For example, a bit line may couple the bit connections of one or more memory cells with a sense amp.

The term "word line" as used herein also refers to a conductive structure that is configured to electrically inter-couple portions of a memory. A word line may couple the word line connections of one or more memory cells with a memory controller.

An issue in flash memory design is known as "charge disturb," especially as the size of the memory scales down from 90 nm to 32 nm. As the memory cells are packed into a small area, their structures and component elements come closer together. Forming the bit lines closer together, for example, shortens the length of the channel defined between them and allows more devices to be formed in the same area. In addition, for dual memory cell devices, adjacent memory cells share common bit lines. These characteristics create some undesirable side effects. When there are, for example, two distinct quantity of charges on opposite sides of a dual cell memory, the charge on the bits can contaminate or disturb one another. In addition, placing high voltage levels on a common bit line when programming a memory cell can cause excess charge to be placed on an adjacent bit. The effect of this is that the sensing window for determining the value of the data can change. In accordance with this, the term "charge disturb" refers to an un-programmed cell (a cell in the "1" state for a SLC or the equivalent in a MLC), in which the voltage threshold for the cell has been undesirably shifted up for the cell above an expected voltage threshold.

The term "address syndrome data" means any data that is used to identify the location of a bit that is re-written from an un-programmed state to a programmed state because it exhibited charge disturb.

Briefly stated, in one embodiment the invention determines whether any un-programmed cell is affected by charge disturb by comparing the voltage threshold of the un-programmed ("1") cells against a reference voltage. If the voltage threshold for the un-programmed cell exceeds the reference voltage, the failed or defective un-programmed cell will be then be programmed. This will flip the defective "1" to a new "0" or programmed value. To account for the location of the failing memory cell, address syndrome bits are used to identify the location of the defective memory cell.

In another embodiment, the reference voltage may be set to be 200 mv to 400 mv above the expected typical voltage threshold for an un-programmed cell. In yet another embodiment, the reference voltage may be determined as a function of the number of defective un-programmed cells. In another embodiment, the verification of the voltage threshold for un-programmed cells may occur after refreshing and verification of programmed data.

FIG. 1 shows components of one embodiment of an environment in which the invention may be practiced. Not all the components may be required to practice the invention, and variations in the arrangement and type of the components may be made without departing from the spirit or scope of the invention. As shown, memory 100 of FIG. 1 includes memory array 102 and individual memory devices 103 located within memory array 102. Individual memory devices 103 are typically multi-cell memory devices or the like. Memory devices 103 are arranged in N+1 rows and M+1 columns in memory array 102. In one embodiment, each row of memory array 102 is accessed by two of the bit lines BL0 to BLN. Each column of memory array 102 is accessed by one of word lines WL0 to WLM. Accordingly, each of memory devices 103 can be accessed by activating the corresponding bit lines and a corresponding word line of the cell. In one embodiment, each column of memory array 102 defines a data word. If N+1 has a value of 8, for example, the cells in each column of memory array 102 define a byte of data.

Memory 100 can also include reference generator 106, sense amps 108, decoder 109, and memory controller 110. Reference generator 106 is configured to provide a reference signal (e.g., a reference voltage or a reference current). Sense amps 108 are configured to provide read data by comparing the reference signal to sensed signals from individual memory cells 103. For example, when word line WL0 is activated, sense amps 108 can provide read data corresponding to each of the memory cells in column 104 or a portion of the memory cells in column 104. Sense amps 108 are also configured to write individual memory devices 103. For example, sense amps 108 can provide separate write signals to each of the memory cells in column 104 or a portion of the memory cells in column 104 to write a logic state to these memory cells.

Decoder 109 is configured to selectively couple individual sense amps 108 to individual memory devices 103 for reading and/or writing. In one embodiment, decoder 109 includes a sector decoder. As such, decoder 109 may be arranged to selectively couple individual sense amps 108 to a particular column or grouping of columns within memory 100. For example, a grouping of columns may define a sector, and another grouping of columns may define another sector. In another embodiment, memory 100 may include an array decoder for selectively coupling sense amps 108 to memory array 104 or another array of memory 100 (not shown). For example, decoder 109 may form a portion of such an array decoder. In addition, embodiments of array decoders can be configured to work separately or in conjunction with a sector decoder.

Memory controller 110 is configured to drive the various components of the memory 100, including reference generator 106, sense amps 108, and decoder 109. Memory controller 1 10 is also configured to activate and de-activate individual word lines WL0 to WLM for reading and/or writing to memory array 102. For example, memory controller 110 can provide a select signal to one of the columns WL1 to WLM to activate that column. Further, memory controller 110 can provide a select signal to decoder 109 for selecting particular rows BL0 to BLN (or sector) to be written to or read from.

In general, embodiments of memory 100 can be configured differently. For example, components may be added to or omitted from memory 100 and/or components may be combined in memory 100. In one embodiment, word lines WL0 to WLM may be arranged in rows (instead of columns), and bit lines BL0 to BLN may be arranged in columns (instead of rows). Further, other arrangements of bit lines and word lines are possible. Embodiments of memory devices 103 can be configured to receive any of a wide variety of current and/or voltage signals for reading and/or writing to individual memory cells. In one embodiment, a memory cell can receive a specific level of current or voltage for reading and/or writing to the memory cell. In another embodiment, a memory cell can receive a combination of current and voltage signals for reading and/or writing the memory cell.

Figure 2:
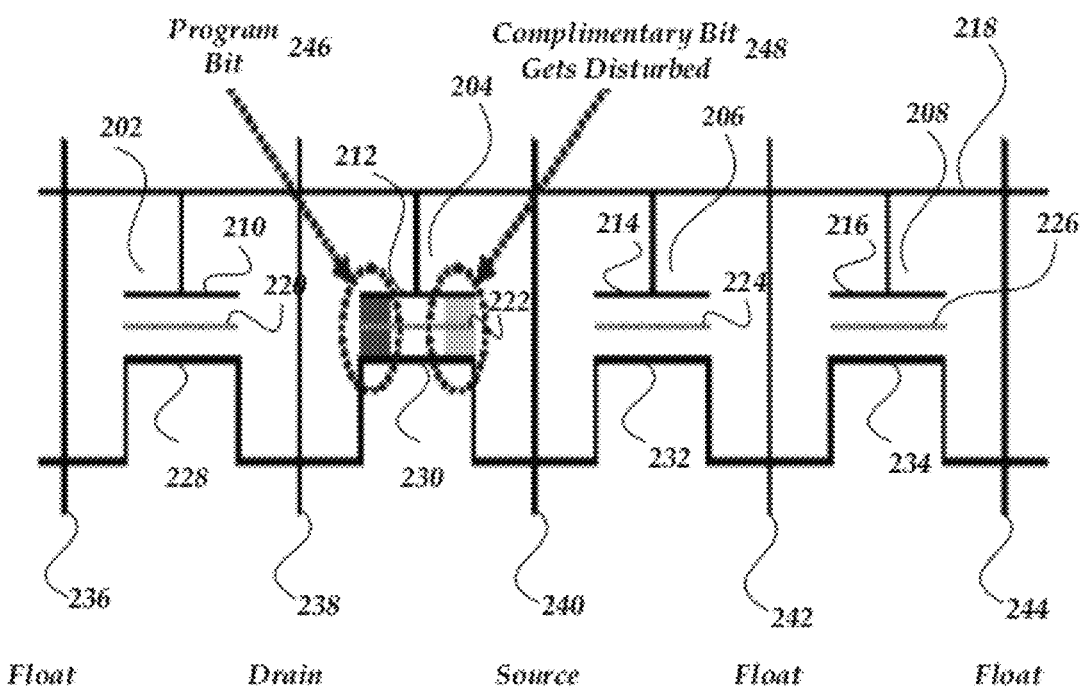
FIG. 2 is a diagram showing an example of charge disturb of a complementary bit in a dual cell device.

One method of increasing the capacity of a memory array without significantly increasing the dimensions of the array is to use two cells for each transistor device, which is a dual cell memory device. An example of a dual cell device, in this instance a NOR gate flash, is shown in FIG. 2. Memory devices 202 through 208 are standard MOSFETs, except that each transistor has two gates instead of one. As an example, memory device 204 consists of control gate 212, floating gate 222 and MOSFET channel 230. Control gate 212 is connected to word-line 218. Floating gate 222 may be insulated all around by an oxide layer, and is interposed between control gate 212 and MOSFET channel 230. MOSFET channel 230 is connected to bit lines 238 and 240. Information is stored in floating gate 222, in this example as bit 246 and bit 248 which are located in the same floating gate but at different locations.

As an example, when bit 246 of memory cell 204 is to be programmed, the memory array is configured such that bit line 238 acts as the drain and bit line 240 acts as the source. When a sufficiently high source to drain current is produced, some high energy electrons shunt through the insulating layer between MOSFET channel 230 and into floating gate 222 via a process called hot-electron injection. In programming bit 248, bit line 240 is configured by the memory array to act as the drain and bit line 238 is configured to be the source. Again, a source to drain current is created to be sufficiently high to cause some electrons to jump through the insulating layer between MOSFET channel 230 to floating gate 222. Because of the way that the channel is formed within the MOSFET, electrons tended to be trapped in the floating gate on one side of the floating gate versus the other side depending on which bit-line is acting as the source versus the drain for the device. In essence, the probability of electrons jumping the potential barrier between MOSFET channel 230 and floating gate 222 is highest at the location of bit 246 when bit line 238 acts as the drain, bit line 240 as the source, an elevated voltage is applied to control gate 212, and the source to drain current is sufficiently high. Likewise, the probability of electrons jumping the potential barrier between MOSFET channel 230 and floating gate 222 is highest at the location of bit 248 when bit line 240 acts as the drain, bit line 238 acts as the source, an elevated voltage is applied to control gate 212, and the source to drain current is sufficiently high to cause high energy electrons to jump through the layer.

As shown in FIG. 2, each control gate 210 through 216 is connected to the same word-line 218, while each of the individual memory devices are connected to bit-lines such that each device shares one bit-line with one other device. This allows individual memory cell accessing by activating the appropriate word-line and set of bit-lines.

When the bit to be programmed is, for example, bit 246, then bit 248 is known as the complementary bit. During programming of bit 246, some electrons may be injected into the location of complementary bit 248. The complementary bit may also receive excess charge if the drain voltage is not well controlled. The phenomenon where additional charge is inadvertently added to a memory cell is an example of charge disturb. It is difficult to predict the amount of charge disturb due to drain voltage overshot and the degradation of the flash memory cells across cycling. In a situation where bit 246 is programmed and bit 248 is un-programmed, a higher degree of charge disturb occurs with respect to the complementary bit 248.

Charge disturb not only may affect a complementary bit, but may also affect neighboring memory devices. As the demands for smaller memory devices and higher storage densities increases, the distances between bit-lines, word-lines and the structures of the memory devices decreases. The decrease in distances may result in a greater potential for charge disturb in adjacent devices.

Figure 3:
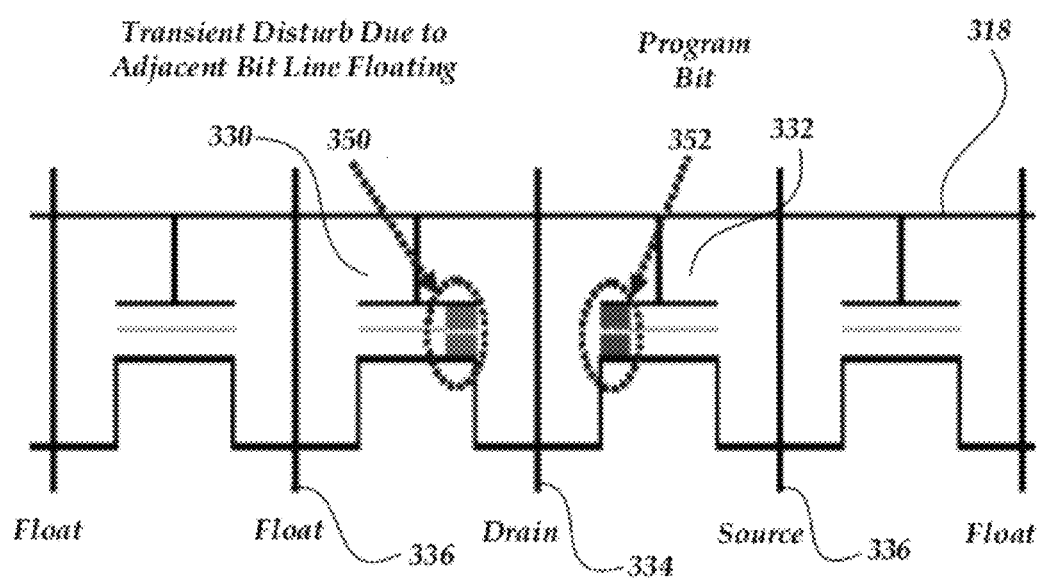
FIG. 3 is a diagram showing an example of charge disturb in a cell on an adjacent bit line to the programmed cell.

FIG. 3 shows charge disturb occurring between two bits in adjacent memory cells. The charge disturb in this particular example occurs because the two memory devices 330 and 332 share a common bit line 334 and a common word line 318. When memory device 332 is being programmed, common bit line 334 is acting as a drain and word line 318 is set to a high voltage. Since bit line 336 is floating, there is a possible potential from bit line 334 to bit line 336 and the potential for electrons to be injected into memory cell 350.

Figure 4:
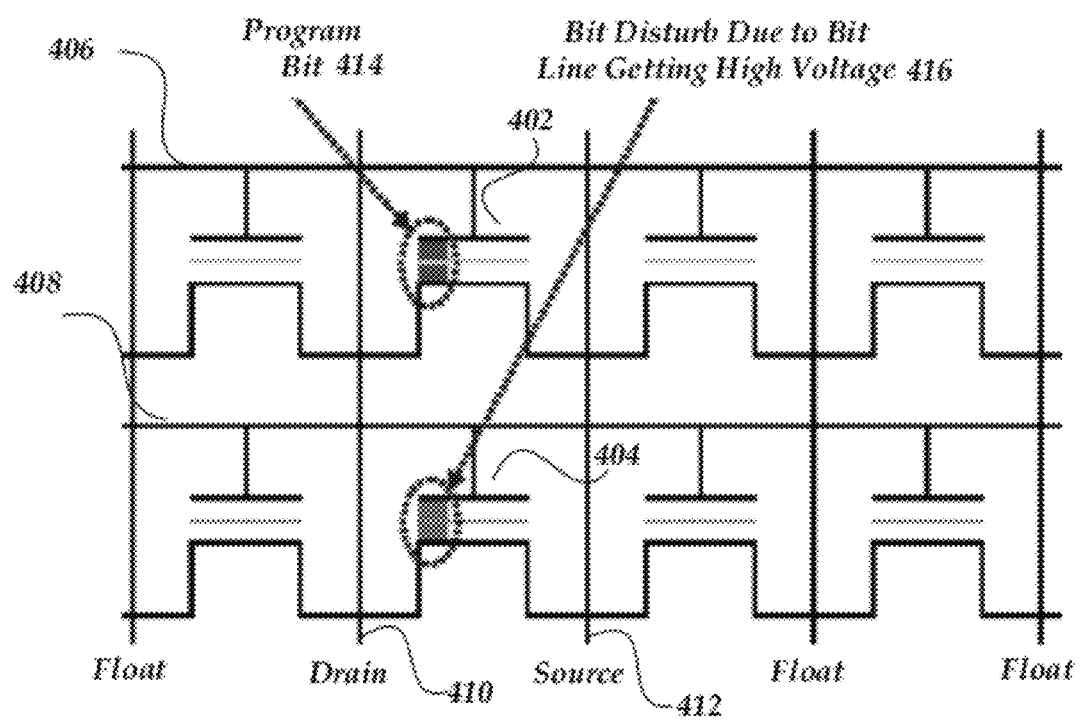
FIG. 4 is a diagram showing an example of charge disturb in a cell on an adjacent word-line.

FIG. 4 shows two sets of memory cells on adjacent word-lines. Memory cell 402 is connected to word-line 406 while memory cell 404 is connected to word-line 408. Both memory cells 402 and 404 are connected to bit lines 410 and 412. In programming memory cell 402, bit line 410 acts as the drain and bit line 412 acts as the source. The only difference between memory cell 402 and 404 is that when memory cell 402 is being programmed, word-line 406 is set to a high voltage while word-line 408 is floating. Because of the high drain to source potential, some charge disturb may occur for bit 416 of memory cell 404 when programming bit 414 of memory cell 402.

Figure 5:
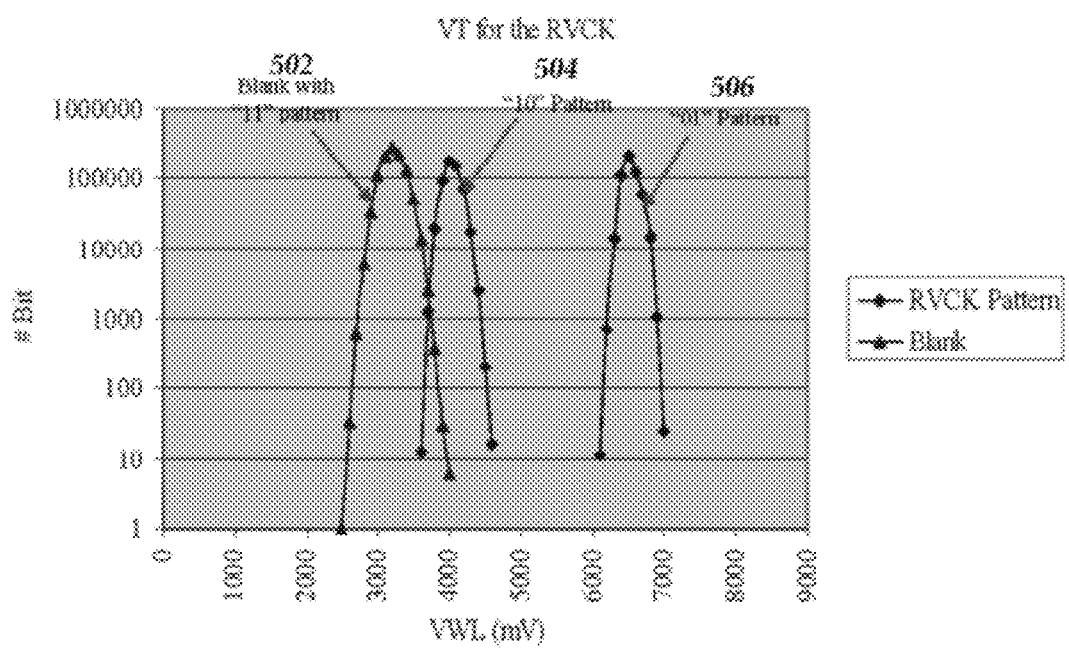
FIG. 5 shows the voltage threshold patterns for a memory device with various programmed patterns.

FIG. 5 is a graph illustrating the voltage thresholds in a memory array consisting of dual bit cell devices. The voltage threshold ($V_t$) is measured in millivolts and plotted on the x axis while the distribution or number of occurrences of particular $V_t$ are plotted on the y axis on a logarithmic scale. Plot 502 shows a blank pattern programmed into the memory device, which corresponds to the un-programmed or "11" pattern for the dual bit memory devices of the memory array. The voltage thresholds range from approximately 2500 mv up to approximately 4000 mv.

For convenience, plots 504 and 506 are shown on the same graph. These plots show a reverse checkerboard pattern in which the memory array is programmed in a "10" pattern for one dual memory device and an "01" pattern for the next adjacent dual memory device, with the pattern repeating throughout the memory array. This corresponds to having the first bit un-programmed and the second bit programmed for the first device, and having the first bit programmed and the second bit un-programmed for the second device. In this instance, the voltage thresholds range from approximately 3600 mv up to 4600 mv for the un-programmed bit of the first device as shown in plot 504. For plot 506, the voltage threshold ranges from approximately 6100 mv up to 7000 mv. The typical sensing window between determining whether a device is programmed as a "10" versus an "01" is 1400 mv. That is, for the first memory cell of each device the difference in detecting whether it is a "1" when the complementary bit is "0" versus detecting that it is a "0" when the complementary bit is a "1" is 1400 mv.

Figure 6:
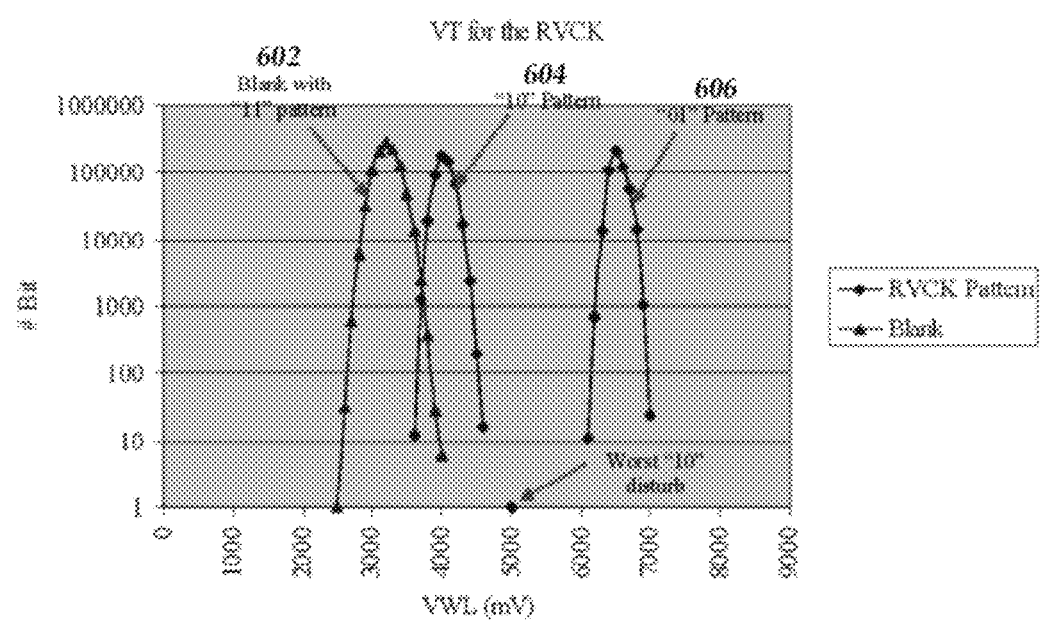
FIG. 6 shows the voltage threshold patterns for a memory device that demonstrates a charge disturb for an un-programmed cell.

FIG. 6 shows an instance where charge disturb can become worse and causes a voltage threshold shift where the window for sensing is only 1200 mv. In FIG. 6, plot 602 shows the voltage threshold for an un-programmed device which has a "11" pattern. Plot 604 shows the voltage threshold when the device has a "10" pattern, with an instance of an un-programmed bit having a voltage threshold up to 5000 mv due to charge disturb. Plot 606 shows the voltage threshold for the "01" pattern. As apparent, the threshold voltage sensing window between the "10" and the "01" pattern is reduced to approximately 1200 mv because of charge disturb.

In the situation where there is a charge loss on a programmed bit, there is a refresh scheme to bring the "0" voltage threshold back to the program voltage threshold. This scheme involves reading each word line into a buffer, refreshing the word line and then verifying the programming and re-programming if verification fails until all of the bits with charge loss are brought back to the normal voltage threshold. However, there has been no special scheme to recover any charge gain of the "1" voltage threshold back to the normal erase voltage threshold. The only way to do this would be to execute an erase operation and then program back the previous data. This is because it is not possible in current flash design to erase a single bit in a word line. The erase for current flash designs are generally done in segments, for example blocks or sectors. All the cells in an erase segment must be erased together. However, this leads to a complicated design, takes up more die size as the previous data needs to be stored in another volatile/non-volatile memory array first before execution of the erase operation.

Figure 7:
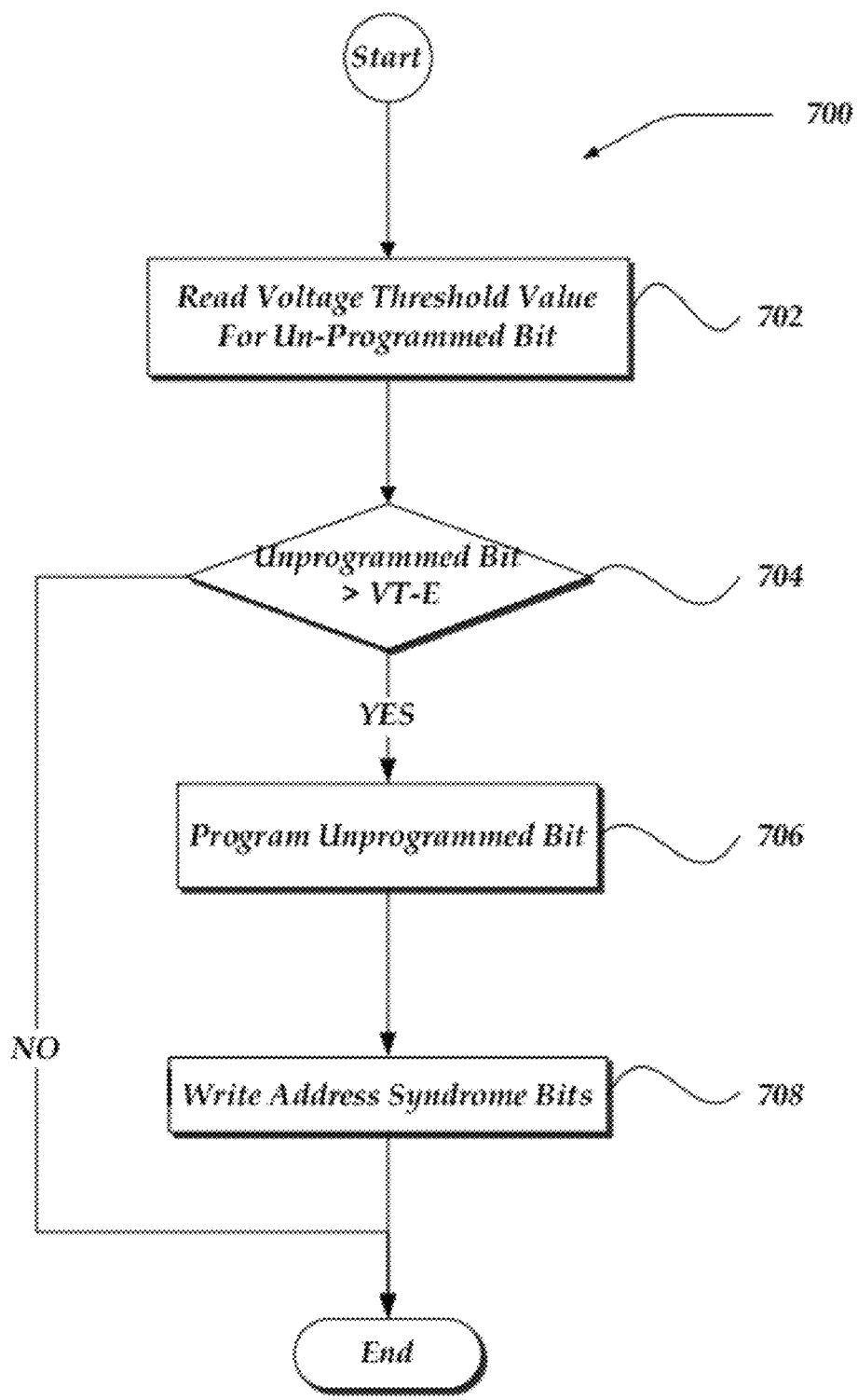
FIG. 7 shows an example of a program flow for determining and correcting charge disturb for un-programmed bits.

The process for accounting for charge disturb is shown in FIG. 7. Charge disturb flow 700 preferably occurs after the refresh scheme to bring the voltage threshold back to the program threshold voltage for charge loss in a programmed bit. However, the flow may occur before the refresh scheme for charge loss or at other points in the flow.

The flow starts in block 702 by reading the voltage threshold for each device that has an un-programmed memory cell. In one embodiment, only the voltage threshold for the un-programmed bits are read. The voltage threshold for an un-programmed bit has a variance or range within which it will fall and still be considered to have a "1" data value. This range may be predetermined or may determined through a reference cell. The voltage threshold for the un-programmed bit is compared against a predetermined voltage threshold VT-E as shown in decision block 704. The reference voltage, VT-E, may be a new reference cell that has a voltage threshold 200 mv to 400 mv higher than a typical or expected high un-programmed or "1" voltage threshold. In other words, in this example, VT-E may be set to be 200 mv to 400 mv higher than the upper range of voltage thresholds that define data in an un-programmed state. This range can be set higher than 400 mv depending on the number of failing "1" or un-programmed bits. In one embodiment, the reference voltage may be set to be the function of the number of failing un-programmed bits. For example, the higher the number of failing un-programmed bits, the higher the reference voltage threshold. If the voltage threshold of the un-programmed bit does not exceed the reference voltage VT-E, then the un-programmed bit does not suffer from charge disturb. In such a case, no action is necessary with respect to the particular bit. If the voltage threshold of the un-programmed bit exceeds the reference voltage VT-E, then the un-programmed bit has charge disturb. In that instance, the program flow moves to block 706 in which the failed or defective "1" will be programmed to a "0". This will flip the defective "10" to a new "00" pattern. One of the benefits to this is that this will shift the voltage threshold for the complementary bit higher.

After programming the un-programmed bit in block 706, the change to the un-programmed bit must be accounted for. This may be done in one example by using address syndrome bits to memorize the failing location. Address syndrome bits are programmed together with the programming of the defective "1" to save program cycle time as shown in block 708. For each defective cell, three address syndrome bits may be written to account for the defective cell and this amount may increase proportional with the number of defective bits, depending on the addressing scheme. Alternative methods of writing address syndrome data may be used. As another example, the address syndrome data may be stored along with information on the associated word line.

Charge disturb flow 700 may repeat for each of the un-programmed bits of data. In one embodiment, the threshold voltage values for a word line will be read out at the same time, and the verification of correct un-programmed threshold voltage will be done for each of the read out threshold voltage values. In another embodiment, the read out and comparison may be done on block or sector levels.

The address syndrome bits may be used during read-out of the data to identify which bits have been changed from an un-programmed value to a programmed value. As one example, when the data is read from the word line, the address data may also be read at the same time and used to modify the data read from the word line. This permits assurance of the integrity of the data within the memory array on read out.

Figure 8:
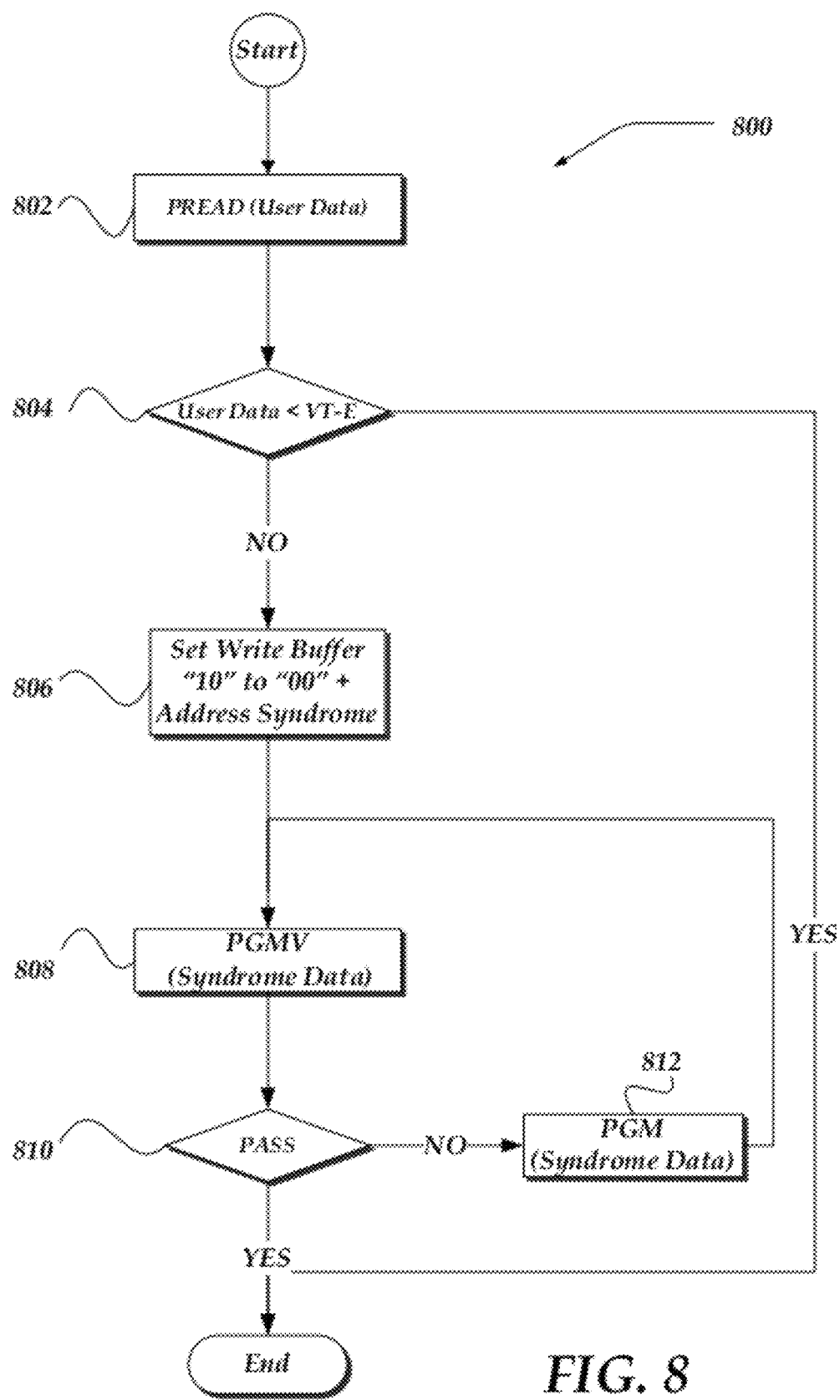
FIG. 8 shows another embodiment of a program flow for determining and correcting charge disturb for un-programmed bits.

Another example of the flow for correcting charge disturb is shown in FIG. 8. In block 802, the threshold voltage for the user data is read from the flash memory, typically a word line at a time. However, the information may be read on block, sector or any other level. Next the read user data threshold value is compared against a maximum threshold value in decision block 804. The maximum threshold value may or may not be a fixed value as set forth above. The comparison determines whether the voltage threshold for the un-programmed bits exceeds a maximum reference voltage VT-E. In such an instance, the un-programmed bit would suffer from charge disturb. If in decision block 804 the maximum reference voltage is not exceeded, then the un-programmed bit passes the verification step. If the un-programmed bit fails the verification step then the write buffer sets the "10" value of the examined bits to "00" and also sets the address syndrome bits in block 806. Each word line may have its own address syndrome bits. These address syndrome bits may then be read out with the word line and used to correct the word line. Alternatively, the address syndrome bits may be associated with particular blocks, sectors or other levels of the memory array. The bit suffering from charge disturb and the address syndrome bits collectively is syndrome data. The programming of the syndrome data is verified in block 808. If the verification fails in decision block 810, the syndrome data is rewritten as shown in block 812 and the verification step 808 occurs again. Once the syndrome data programming is verified, the routine ends.

Figure 9:
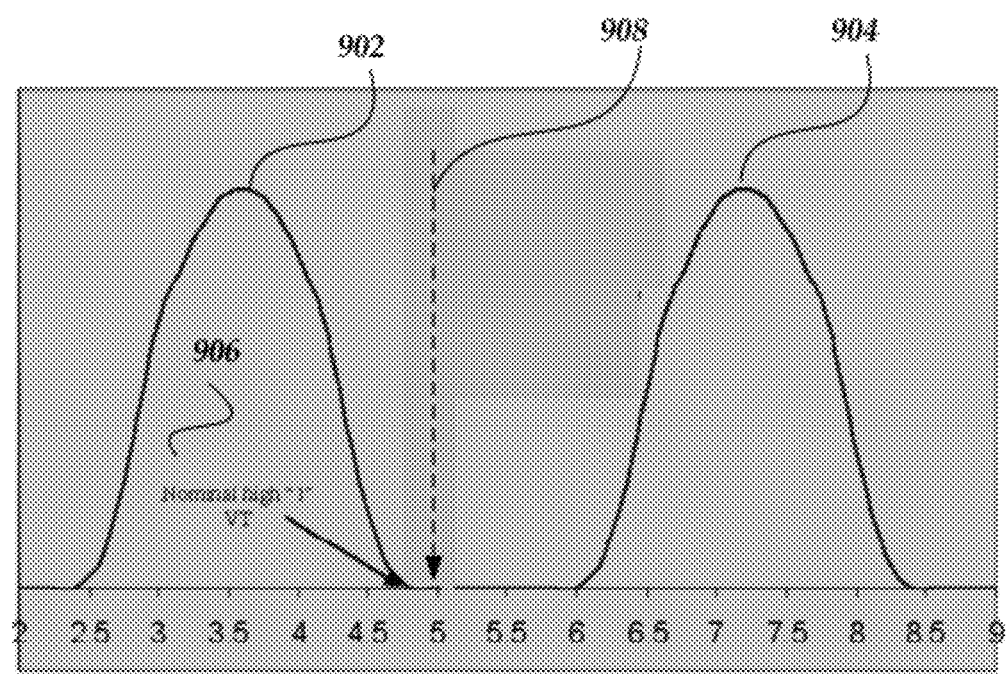
FIG. 9 shows an example of a reference cell setting for detecting abnormal, un-programmed bits.

The graph of FIG. 9 shows the voltage threshold distribution for the un-programmed bits of a dual cell device with the first bit un-programmed and the complementary bit programmed (a "10") in curve 902 and for dual cell device with the first bit programmed and the complementary bit un-programmed (a "01") in curve 904. The curve 902 has a high "1" or un-programmed voltage threshold as shown in 906, which in this case is approximately 4.75 volts. The adjustable new reference voltage 908 is shown to be 200 to 400 mv higher, at approximately 5000 mv.

What is claimed is:

1. A method in a multi-cell memory device, comprising:
   reading a voltage threshold of a cell in an un-programmed state from the multi-cell memory device;
   programming the cell when the voltage threshold of the cell exceeds a reference voltage; and
   writing address syndrome data in association with the programming of the cell.

2. The method of claim 1 wherein a complementary bit of the cell is in a programmed state.

3. The method of claim 1 wherein the reference voltage is greater than a range of voltage thresholds within which the cell is in an un-programmed state.

4. The method of claim 1 further comprising:
   determining a range of voltage thresholds within which the cell is in an un-programmed state, which range is used during a read operation to determine whether the cell is in the un-programmed or a programmed state; and
   setting the reference voltage to be 200 mv to 400 mv higher than the range of voltage thresholds.

5. The method of claim 1 wherein the reference voltage is proportional to a number of occurrences of un-programmed cells having voltage thresholds exceeding the reference voltage.

6. The method of claim 1 wherein the address syndrome bits are set in conjunction with programming the cell and are used during readout to account for the programming of the cell.

7. The method of claim 1 further comprising:
   determining whether a failure occurs in the programming of the cell; and
   re-programming the cell on occurrence of the failure.

8. The method of claim 1 further comprising:
   marking a location of the cell that exceeds the reference voltage.

9. A flash device comprising:
   a plurality of multi-cell memory devices forming a memory array; and
   a controller coupled to the plurality of multi-cell memory devices and operative to enable actions including:
      reading a voltage threshold of a cell in an un-programmed state from the multi-cell memory device;
      programming the cell when the voltage threshold of the cell exceeds a reference voltage; and
      writing address syndrome data in association with the programming of the cell.

10. The flash device of claim 9 wherein the flash device is used in a memory card, USB flash drive or a consumer electronics application.

11. The flash device of claim 9 wherein the reference voltage is greater than a range of voltage thresholds within which the cell is in an un-programmed state.

12. The flash device of claim 9, wherein the controller is further operative to enable actions including:
   determining a range of voltage thresholds within which the cell is in an un-programmed state, which range is used during a read operation to determine whether the cell is in the un-programmed or programmed state; and
   setting the reference voltage to be 200 mv to 400 mv higher than the range of voltage thresholds.

13. The flash device of claim 9 wherein the reference voltage is proportional to a number of occurrences of un-programmed cells having voltage thresholds exceeding the reference voltage.

14. The flash device of claim 9 wherein the address syndrome bits are set in conjunction with programming the cell and are used during readout to account for the programming of the cell.

15. The flash device of claim 9, wherein the controller is further operative to enable actions including:
   determining whether a failure occurs in the programming of the cell; and
   re-programming the cell on occurrence of the failure.

16. The flash device of claim 9, wherein the controller is further operative to enable actions including:
   marking a location of the first un-programmed bit that exceeds the reference voltage.

17. The flash device of claim 9, wherein the controller includes means for programming multi-cell memory devices.

18. A system for storing information comprising:
   a memory array having a plurality of multi-cell memory devices; and
   a controller coupled to the memory array and operative to enable actions including:
      determining a reference voltage that is greater than a range of voltage thresholds within which a cell is in an un-programmed state, which range is used during a read operation to determine whether the cell is in the un-programmed or programmed state;
      reading a voltage threshold of the cell, which cell has been set to be in the un-programmed state;
      programming the cell when the voltage threshold of the un-programmed cell exceeds the reference voltage; and
      writing address syndrome data in association with the programming of the cell.

19. The system of claim 18 further comprising:
   setting the reference voltage to be 200 mv to 400 mv higher than a range of voltage thresholds within which the cell is in an un-programmed state.

20. The system of claim 18 wherein the controller includes a means for programming multi-cell memory devices.

* * * * *